United States Patent [19]

Herr et al.

[11] Patent Number: 5,919,602
[45] Date of Patent: Jul. 6, 1999

[54] PHOTOCURABLE COMPOSITION BASED ON ACID FUNCTIONAL PRIMARY RESINOUS MERCAPTANS

[75] Inventors: Donald E. Herr, Flemington, N.J.; John S. Hallock, Ellicott City, Md.

[73] Assignee: MacDermid Acumen, Inc., Middletown, Del.

[21] Appl. No.: 08/879,092

[22] Filed: Jun. 19, 1997

[51] Int. Cl.[6] ........................................ G03C 5/00
[52] U.S. Cl. ..................................... 430/281.1; 430/287.1
[58] Field of Search ...................................... 528/373, 375, 528/376, 176, 192, 219; 430/281.1, 287.1; 568/67, 61

Primary Examiner—Janet Baxter
Assistant Examiner—Rosemary Ashton
Attorney, Agent, or Firm—John L. Cordani

[57] ABSTRACT

Acid functional primary thiols having no hydroxy substituents in the beta position, and also having aromatic backbones, can be combined with unsaturated resins to make aqueous base-developable, photoimaging compositions such as solder masks and resists.

29 Claims, No Drawings

PHOTOCURABLE COMPOSITION BASED ON ACID FUNCTIONAL PRIMARY RESINOUS MERCAPTANS

FIELD OF THE INVENTION

The present invention relates generally to the field of photoimageable, aqueous base developable compositions, particularly substantially ester-free, acid-functional thiol-functional resins having two or more primary aliphatic thiol groups having no hydroxy substituents in the beta positions with respect to the sulfur atom, the resins also having novolak, cyanurate, or isocyanurate backbones. These resins are generally useful in combination with unsaturated resins as photoresists and solder masks.

BACKGROUND OF THE INVENTION

Curable coating compositions have wide application in a number of fields, as they are useful for protecting various kinds of surfaces from severe chemical and physical environments. A solder mask, for example, is a permanent coating for a printed circuit board that must not cover certain parts of the circuitry on the board such as the contact points. A photoimageable, UV-curable solder mask is applied as a coating to the entire board, and then exposed to ultraviolet light through a pattern, or image. In the case of "negative resists," where the light falls on the coating, the coating hardens, or cures. The portions that are not exposed to the light remain unhardened and are washed away in a developer solution. Sometimes it is desirable to further treat the solder mask to toughen it. In that case, the coating might be baked in order to crosslink it and further improve its chemical, heat, and moisture resistance.

Materials which are useful in the above-described processes are well known, and are available as formulations that are developable in solvents made of volatile organic compounds (VOCs). VOCs, however, have been identified as pollutants and have been targeted by a variety of regulations aimed at reducing their use. Accordingly, efforts have been directed toward obtaining photoimageable coating materials that can be developed in aqueous solutions.

One technique for rendering a photoimageable coating material developable in an aqueous solution is to add acid functional groups to an organic molecule that is otherwise known to yield good physical properties when formulated as a coating. For example, certain commercially available formulations use polymers modified to incorporate significant amounts of carboxylic acid functional groups in order to confer dispersibility in aqueous base on an otherwise hydrophobic molecule. Such coatings are typically developable in alkaline water (for example, 1% carbonate) solutions. Of these, systems utilizing acrylates and epoxies predominate.

Acrylate/epoxy systems are well-known. The photoinitiated radical chain crosslinking reactions of acrylates represent the most common type of mechanism utilized in UV curable coatings. There are, however, inherent weaknesses in these systems. The radical chain reaction is inhibited by atmospheric oxygen, a problem that can be minimized through a combination of approaches such as using high intensity UV sources, higher levels of photoinitiators or synergists than would otherwise be required, or photocuring in vacuo or under inert atmospheres. In spite of these measures, there is usually an "incubation period" during which oxygen and photoinitiator are being consumed without significant crosslinking taking place. In solder masks, all of these approaches are frequently applied in an effort to reduce the necessary exposure times and provide a better surface cure. However, these efforts tend to have a negative impact on other performance features, such as sidewall profiles, thereby limiting image resolution. Additionally, acrylate based systems by definition have high levels of ester linkages, which can become hydrolytically weak links in demanding applications like the solder mask, where extremes of pH and temperature are encountered not only in process (such as plating baths) but sometimes in the finished product. Acrylate systems occasionally exhibit insufficient adhesion. Adhesion promoters can sometimes successfully be used, but these may interfere with other desirable properties of the coating. Finally, acrylate crosslinked coatings can suffer from brittleness due to shrinkage that occurs during photocuring, however this effect can be moderated by utilizing a thermal epoxy cure.

Curable systems that utilize the reaction of thiols with unsaturated hydrocarbons are also known. U.S. Pat. No. 4,020,233, issued to Morgan Apr. 26, 1977 relates to heat-activated compositions comprising ethylenically unsaturated compounds in combination with polythiols and pinacol catalysts. U.S. Pat. No. 4,006,270 issued to Morgan Feb. 1, 1977 relates to novel solid polyfunctional unsaturated compounds derived from styrene-allyl alcohol copolymers reacted with polythiols for use in imaging applications. U.S. Pat. No. 3,904,499 issued to Morgan Sep. 9, 1975 teaches the use of solid polythiols based on styrene-allyl alcohol copolymers with liquid polyfunctional unsaturated compounds. All of the above references teach the use of thiols which will yield ester-containing cross-links upon curing, and all use organic solvents in the development process.

Other reactions utilizing thiols and unsaturated compounds are known. U.S. Pat. No. 4,135,047 issued to Morgan Jan. 16, 1979 relates of the preparation of thioethers using a benzopinacol initiator. Acid-containing thiols are mentioned as potential raw materials. No specific use of the resulting material is disclosed, and there is no discussion of photoimaging, much less water development.

Thiols which are ester-free are known. See U.S. Pat. No. 4,591,522 issued to Kang, et al. May 27, 1986, which relates to liquid photopolymer formulations made with the reaction product of a non-ester containing polythiol with an unsaturated chlorendate to yield a fire-retardant, hydrolysis-resistant final product. Neither photoimaging nor water-developable formulations are disclosed.

Acid functionalized polythiols have been used in photoresists as adhesion promoters. See U.S. Pat. No. 5,091,483 issued to Lin et al. May 28, 1991. In this case, the polythiol is used as an adhesion-promoting additive at very low, non-stoichiometric amounts, in an attempt to avoid scumming in an acrylate curing system. No mention is made of thiol-ene photoimaging systems.

Acid functional polythiols of a different class, the β-hydroxy-functional thiols, have been found to be useful in photoresist applications, and are disclosed in U.S. patent application Ser. No. 08/879,089 filed concurrently herewith by the same inventors.

SUMMARY OF THE INVENTION

It is an object of the present invention to provide a thiol-ene curing photoimageable composition that is developable in aqueous base. A further object of this invention is to provide a photoimageable composition having improved hydrolytic stability. It is yet a further object of this invention to provide a contact-imageable solder mask.

The present inventors have found that acid functional, ester-free multifunctional thiol resins having novolak, cyanurate, or isocyanurate backbones are generally useful in combination with unsaturated resins as aqueous-base developable photoresists and solder masks. An advantage of the present invention is that the system exhibits greatly reduced, or no, sensitivity to oxygen during photoimaging. A further advantage is that the system has high thiol functionality in addition to the requisite acid functionality, and therefore has good photospeed. Yet another advantage is that the system may exhibit improved adhesion to the substrates commonly used in the making of printed circuit boards, thereby reducing or eliminating the need for adhesion promoters. Many embodiments of the present invention are completely ester-free, and therefore may be expected to exhibit improved hydrolytic stability.

These and other objects and advantages of the present invention will become apparent through the text and examples herein.

DETAILED DESCRIPTION OF THE INVENTION

Thiols

The thiols of the present invention are preferably substantially ester-free, acid-functional thiol-functional resins having two or more primary aliphatic thiol groups having no hydroxy substituents in the beta positions with respect to the sulfur atom, the resins also having novolak, cyanurate, or isocyanurate backbones. In one embodiment of the invention, thiol resins can be made by simultaneously reacting a mixture of thiolacetic acid (TAA) and β-mercaptopropionic acid (β-MPA) with the allyl groups of an unsaturated resin, and then subjecting the reaction product to hydrolysis. Hydrolysis under basic conditions is preferred, but acidic conditions can be used.

This is a convenient, high yield (typically >90%) process, which is generally applicable to unsaturated phenol and cresol Novolak resins, and is particularly useful when applied to Bisphenol A derivatives, such as tetraallyl Bisphenol A and hexaallyl Bisphenol A.

This process is simple, adaptable to a wide range of unsaturated resins, and yields a completely ester-free product.

In another embodiment of the invention, the unsaturated resin is first completely converted to a multifunctional thiol by using TAA followed by basic hydrolysis. Subsequently the thiol can be reacted with an anhydride such as succinic, phthalic, tetrahydrophthalic, hexahydrophthalic, trimellitic or mixtures thereof. The ring opening process has been conveniently achieved using pyridine as a catalyst. Relatively slow reaction has been observed when catalyst was not used during initial trials. It has been found that the chemical structure of the anhydride employed has a profound effect on the state of the product acid functional resin. In all cases, the resin viscosity increased significantly upon reaction with the anhydride; the use of an aromatic anhydride such as phthalic anhydride yielded a semi-solid product and the use of trimellitic anhydride yielded a tack-free solid.

In principle, the resins which form the backbone of the acid-functional thiol can be any compound that has or can be functionalized with one or more unsaturated groups and eventually yields the desired coating properties. These include resins represented by derivatives of bisphenol A, cyanurates, isocyanurates, linear aliphatic resins, alicyclic resins, and Novolak resins. As a practical matter, resins with two or more unsaturated groups and substantial aromatic character are preferred. These include unsaturated resins derived from phenol and cresol Novolak resins, as well as unsaturated cyanurate and isocyanurate resins. Unsaturated derivatives can easily be made from such commercially available backbones as Bisphenol A (available from Aldrich Chemical Co.), phenol and cresol Novolak resins (available from Borden Chemical, Inc., Louisville, Ky.), and cyanuric acid (Aldrich). Such resins can readily be converted to unsaturated backbones by treatment with an appropriate base (such as potassium hydroxide) followed by alkylation using various commercially available halide compounds possessing one or more degrees of unsaturation. Pertinent examples of such halides include allyl halides and propargyl halides.

It has been found that, in a preferred embodiment of the current invention, allylated phenol Novolak and bisphenol A backbones can be subjected to heating, which effects the well-known Claisen Rearrangement reaction. This reaction produces a carbon-bound allyl group and regenerated phenolic functionality. These resins can subsequently be further allylated as described generally above and in the Examples. This rearrangement/reallylation procedure can be repeated a second time, if desired. See Japanese patent No. JP04282336 A2, "Aromatic polyallyl compounds as materials for resins," which discloses such materials for use as thermosetting resins. The resin derivatives have higher allyl functionality which will eventually be converted to thiol or acid groups. The acid functional polythiols produced from these precursors have been found to exhibit increased photoreactivity.

Unsaturated resins

In the present invention, the thiol will react, or crosslink, with a polymerizable unsaturated resin. Polymerizable unsaturated resins, that is, resins which contain one or more reactive carbon-carbon double or triple bonds, are sometimes called "ene" resins, and the crosslinking reaction may be referred to as a "thiol-ene" reaction. The unsaturated resin preferably has at least two unsaturated sites, and is substantially ester-free in the same sense the thiol resin is substantially ester-free. That is, the resin is preferred to be wholly ester free, but at least must not have hydrolytically unstable ester groups located within the portions of the molecule that will eventually be involved in crosslinking. The choice of ene resin is influenced by the choice of thiol resin, and vice versa. For example, where it is desired that the uncrosslinked mixture of the thiol-ene system be a liquid, either or both resins may be low molecular weight liquids. Where the uncrosslinked formulation is desired in the form of a tack-free solid upon drying, however, it is usually preferred that one or both of the resins be of a higher molecular weight solid and have substantial aromatic character. These include unsaturated phenol and cresol Novolak resins, as well as unsaturated cyanurate and isocyanurate resins such as triallyl cyanurate, triallyl isocyanurate and 4,4'-bis(allyloxy)benzophenone.

Another class of ene resins useful in the present invention are the ester-free unsaturated resins, such as those described in U.S. Pat. No. 4,006,270 issued to Morgan Feb. 1, 1977 and 3,904,499 issued to Morgan Sep. 9, 1975.

Other Formulation Materials

The thiol-ene formulation may include other additives typical for the desired end use, including photosensitizers, photoinitiators, inhibitors, pigments, dyes, fillers such as alumina, and rheology aids such as fumed silica. The formulation may contain unsaturated oligomers and/or multifunctional thiols as needed to modify the ultimate physical properties of the end product. Where a thermal cure is desired, the formulation may further contain one or more epoxy resins such as the commercially available Epon 825 or Epon 164 resins.

The following Examples are presented for the purpose of illustrating the practice of the present invention. They do not limit the invention, or the claims which follow.

EXAMPLES

Example 1. Synthesis of Tetraallylated Bisphenol A Resin 2, 2'-diallyl-1, 1'-diallyloxy Bisphenol A: 2, 2'-diallyl Bisphenol A (23.1 g, 75 mmol) was dissolved in n-propanol in a 500 mL round-bottomed flask equipped with mechanical stirring and efficient reflux condensor. Crushed NaOH (6.6 g, 160 mmol) was added portionwise with vigorous stirring. The resulting solution was stirred at light reflux for 3 h. Allyl chloride (13.4 mL, 160 mmol) was added dropwise via syringe over 20 min. The reaction was stirred at light reflux for an additional 7 h. The resulting slurry was allowed to cool. The liquids were filtered and solvent removed in vacuo. The remaining oil was dissolved in $Et_2O$ (200 mL) and washed with 5% $HCl_{aq}$ (150 mL) and distilled $H_2O$ (2×150 mL). The organic layer was dried over $MgSO_4$ anhyd. and solvent removed in vacuo to yield a thick yellow oil which exhibited satisfactory $^1H$ and $^{13}C$ NMR and IR spectral features (26.7 g, 92%).

Example 2. Synthesis of Hexaallylated Bisphenol A Resin 2, 2', 6, 6'-tetraallyl-1, 1,-diallyloxy Bisphenol A: 2, 2'-diallyl-1, 1'-diallyloxy Bisphenol A (120.6 g, 310 mmol) was heated to 190° C. under Ar with mechanical stirring in a 3 L three-necked flask equipped with a reflux condensor and addition funnel for 14–18 h to affect the Claisen Rearrangement of the allyloxy substituents. The resulting product was solvated in n-propanol (500 mL). Crushed KOH (44.8 g, 680 mmol) was added portionwise and the resulting solution was heated to light reflux for 4 h. Allyl chloride (61.1 g, 710 mmol) was added dropwise via an addition funnel over the course of 30 min. The reaction was stirred at light reflux for an additional 8 h. The resulting slurry was filtered and solvent removed in vacuo from the filtrate to yield a orange oil which exhibited satisfactory $^1H$ and $^{13}C$ NMR and IR spectral features (117.4 g, 81%; unoptimized).

Example 3. Synthesis of Allylated Phenol Novolak Resin

O-allylated phenol novolak resin: Borden Chemical SD461A phenol novolak resin (10.0 g, 12.6 mmol) was solvated in n-propanol (300 mL) in a 1 L. three-necked flask equipped with mechanical stirrer, addition funnel and reflux condensor. NaOH (4.5 g, 113 mmol) was added and the resulting solution refluxed for 2.5 h. The addition funnel was charged with allyl chloride (10.3 mL) which was added dropwise to the reaction over 40 min. Solid NaCl precipitate was immediately observed. The solution was refluxed for an additional 6 h. The reaction was allowed to cool to r.t. and filtered through a coarse glass fritted filter funnel to remove bulk solids. Solvent was removed from the pale yellow filtrate in vacuo to yield a viscous oil which was dissolved in $CH_2Cl_2$ (200 mL). This solution was extracted with 10 % HCl (200 mL) and $H_2O$ (2×200 mL). Solvent was removed from the organics in vacuo to yield a orange brown oil which exhibited satisfactory $^1H$ and $^{13}C$ NMR and IR spectral features.

Example 4. Claisen Rearrangement and Second Allylation of Phenol Novolak Resin C-allylated-O-allylated phenol novolak resin: The O-allylated novolak resin described above (14.3 g, 13.0 mmol) was solvated in n-propanol (60 mL) in a 500 mL three-necked flask equipped with mechanical stirrer, reflux condensor and addition funnel. Crushed A.C.S. Reagent Grade KOH (6.8 g, 104 mmol) was added and the reaction heated to light reflux for 4 h. Allyl chloride (9.4 g, 122 mmol) was added dropwise via addition funnel over the course of 30 min. The suspension was stirred for an additional 7 h. at light reflux. The resulting slurry had a pH of ~8. The suspension was filtered and solvent removed from the filtrate in vacuo to yield an orange-brown oil which exhibited satisfactory $^1H$ and $^{13}C$ NMR and IR spectral features.

Example 5. Synthesis of Totally Ester-Free, Acid Functional Trithiol Resin

Tris(mercaptopropyl)-mono(carboxypropyl)-Bisphenol A: 2, 2'-diallyl-1, 1'-diallyloxy Bisphenol A (13.0 g, 33.5 mmol), thiolacetic acid (7.18 mL, 100 mmol), β-mercaptopropionic acid (2.92 mL, 33.5 mmol), and Vazo 52 (0.4 g, 2 wt. %) were combined in a 250 mL single-necked flask equipped with mechanical stirring and reflux condensor. The reaction was subsequently heated to 60° C. under Ar for 5 h. $^1H$ NMR of an aliquot indicated incomplete reaction as monitored by disappearance of the allylic proton resonances. Additional Vazo 52 (0.3 g) was added and the reaction was stirred for another 5 h. at 60° C. to yield a thick yellow oil which was completely reacted as indicated by satisfactory $^1H$ and $^{13}C$ NMR and IR data. This material was solvated in THF (68 mL), and NaOH (21.6 g, 540 mmol) dissolved in $H_2O$ (68 mL) was added slowly with vigorous stirring. This solution was heated on a 70° C. bath for 60 min. The resulting slurry was allowed to cool for 10 min. on an ice bath, and was subsequently acidified to pH~1 with conc. $HCl_{aq}$ with cooling. The resulting suspension was poured onto dist. $H_2O$ (300 mL) and extracted with $Et_2O$ (400 mL). The organic layer was isolated and washed with dist. $H_2O$ (2×300 mL). The organics were dried over $Na_2SO_4$ and solvent removed in vacuo to yield a yellow oil which exhibited satisfactory $^1H$ and $^{13}C$ NMR and IR spectral features (18.9 g, 95%). Titratable thiol: 4.6 meq. SH/g resin (92% of theory). Titratable carboxyl: 1.4 meq $CO_2H/g$ resin (84% of theory).

Example 6. Synthesis of Totally Ester-Free, Acid Functional Tetrathiol Resin Tetrakis(mercaptopropyl)-bis(carboxypropyl)-Bisphenol A: 2, 2', 6, 6'-tetraallyl-1, 1,-diallyloxy Bisphenol A (30.0 g, 64.1 mmol), thiolacetic acid (19.5 g, 256.0 mmol), P-mercaptopropionic acid (13.6 g, 128.2 mmol) and Vazo 52 (1.2 g, 2 wt. %) were combined in a 500 mL three-necked flask equipped with a mechanical stirrer and reflux condensor under Ar. The reaction was heated to 60° C. with stirring. A slight exotherm was observed. The reaction was stirred for 4 h., after which additional Vazo 52 (1.2 g) was added. The reaction was stirred at 60° C. for an additional 6 h. $^1H$ NMR indicated nearly complete consumption of unsaturation in the resin. The intermediate thiolacetate/acid was solvated in THF (150 mL), and NaOH (61.5 g, 1.54 mol) dissolved in distilled $H_2O$ (150 mL) was added slowly with stirring under Ar. The resulting solution was heated on a 70° C. bath for 1 h. with vigorous stirring. The reaction was poured into a 1 L beaker and cooled on an ice bath. The solution was acidified to pH<1 with conc. $HCl_{aq}$ with stirring. The resulting slurry was extracted with $Et_2O$ (300 mL), and the organic layer was washed with 10% $HCl_{aq}$ (200 mL) and dist. $H_2O$ (2×200 mL). The organic layer was dried over $MgSO_4$ and solvent removed in vacuo to yield a thick yellow oil which exhibited satisfactory $^1H$ and $^{13}C$ NMR and IR spectral features (40.9 g, 86% unoptimized). Titratable thiol: 4.3 meq SH/g resin (87% of theory). Titratable carboxylate: 1.8 meq $CO_2H/g$ resin (75% of theory).

Example 7. Synthesis of Acid and Thiol Functional Phenol Novolak Resin

Hexakis(mercaptopropyl) mono(carboxypropyl) phenol novolak: O-allylated Borden SD461A phenol novolak resin (10.3 g, 9.6 mmol), thiolacetic acid (4.1 mL, 57.0 mmol) and β-mercaptopropionic acid (0.84 mL, 9.6 mmol) were combined in a 500 mL three-necked-flask equipped with a reflux condensor and mechanical stirring under Ar. The reagents were warmed to 60° C. with stirring. Vazo 52 (0.17 g, 2 wt. %) was added and the reaction was stirred for 4 h. $^1$H NMR indicated high but incomplete conversion as measured by allylic double bond proton resonance disappearance. Additional Vazo 52 (0.17 g, 2 wt. %) was added and the reaction stirred at 60° C. for an additional 6 h to yield a thick oil which exhibited satisfactory $^1$H and $^{13}$C NMR and IR spectral features. This intermediate was solvated in THF (40 mL) with stirring under Ar. NaOH (10.7 g, 270 mmol) dissolved in $H_2O$ (40 mL) was added slowly and the resulting solution was stirred vigorously for 1 h on a 70° C. bath. The resulting solution was poured onto distilled $H_2O$ (200 mL) and acidified to pH<1 with conc. HCl. This slurry was extracted with $Et_2O$ (250 mL), and the isolated organics were washed with dist. $H_2O$ (3×200 mL), dried over $MgSO_4$ anhyd. and solvent removed in vacuo to yield a thick orange-brown oil. Titratable thiol: 2.7 meq SH/g resin (64% of theory). Titratable carboxylate: 0.6 meq $CO_2H$/g resin (83% of theory).

Example 8. Synthesis of Totally Ester-Free Tetrathiol Resin

Tetra(mercaptopropyl) Bisphenol A: Bisphenol A tetrathiolacetate (obtained from 2, 2'-diallyl-1, 1'-diallyloxy Bisphenol A via the methodology detailed in Example 5 but using 4 molar eq. of thiolacetic acid relative to one molar equivalent of tetraallylated Bisphenol A resin and zero molar eq. of β-mercaptopropionic acid; 47.8 g, 690 mmol) was solvated in THF (120 mL) in a 500 mL single-necked flask equipped with magnetic stirring and reflux condensor under Ar. NaOH (44 g, 1100 mmol) dissolved in $H_2O$ (120 mL) was added cautiously with stirring. The resulting solution was heated with vigorous stirring on an 85° C. bath for 1 h. The resulting slurry was allowed to cool, and was subsequently neutralized with 50% $HCl_{aq}$ to pH~2. $Et_2O$ (250 mL) and dist $H_2O$ (200 mL) were added and the organic layer extracted. The organics were isolated and washed with dist. $H_2O$ (3×200 mL), dried over $MgSO_4$ anhyd. and solvent removed in vacuo to yield a brown, viscous oil which exhibited satisfactory $^1$H and $^{13}$C NMR and IR spectral features (~quantitative). Titratable thiol: 6.2 meq SH/g resin (82% of theory).

Example 9. Solid, Acid Functional Thiol Resin via Trimellitic Anhydride Ring Opening Tris(mercaptopropyl)-mono(trimellitic thioester) Bisphenol A: Tetra(mercaptopropyl) Bisphenol A (4.81 g, 29.0 mmol), trimellitic anhydride (1.38 g, 7.2 mmol) and pyridine (13 drops) were combined in a 50 ml round bottomed flask equipped with magnetic stirring and a reflux condensor under Ar. The contents were dissolved in MeCN (40 mL) with vigorous stirring. The solution was heated to light reflux for 13 h. Bulk solvent was removed via rotary evaporator, and the remaining slurry dissolved in $Et_2O$ (150 mL) and acetone (40 mL). These organics were washed with 1% $HCl_{aq}$ (150 ml) and dist. $H_2O$ (2×100 mL). The organic layer was dried over $MgSO_4$ and solvent removed in vacuo to yield a yellow solid which exhibited satisfactory $^1$H and $^{13}$C NMR and IR spectral characteristics (~quantitative). Titratable thiol: 3.2 meq SH/g resin (77% of theory). Titratable carboxylate: 2.4 meq $CO_2H$/g resin (71% of theory).

Example 10. Liquid, Acid Functional Thiol Resin via Sucinnic Anhydride Ring Opening The procedure described in Example 9 was performed using Tetra(mercaptopropyl) Bisphenol A (2.60 g, 5.0 mmol), sucinnic anhydride (0.25 g, 2.5 mmol), pyridine (4 drops) and THF (2 mL) solvent to yield a viscous liquid which exhibited expected $^1$H and $^{13}$C NMR and IR spectral features. Titratable thiol: 4.8 meq SH/g resin (86% of theory). Titratable carboxylate: 0.8 meq $CO_2H$/g resin (100% of theory).

Example 11. Photoimageable Composition

An approximately 50% solids photoimageable composition was formulated from the following reagents:

| | |
|---|---|
| Acid functional thiol resin described in Example 6: | 0.50 g |
| Triallyl cyanurate (DeGussa) | 0.19 g |
| Irgacure 651 (Ciba): | 0.09 g |
| Cab-o-sil TS-720 (Cabot): | 0.14 g |
| Acetone: | 1.0 g |

This composition was applied to a copper clad epoxy/fiberglass laminate using a drawdown bar to produce an approximately 2 mil coating. The board was dried for 20 min. in an 80° C. oven to yield a tack free film. The film was then contact imaged in air through a phototool using a Colight 1330C 5 kW UV lamp. Exposure energy was approximately 360 mJ/cm$^2$. The unexposed regions of the coating were readily developed from the board using a 1% aqueous carbonate solution to produce an image with better than 5×5 mil resolution. The mask can be further baked in a 150° C. oven for 30 min. to yield a tough, scratch resistant protective coating.

Example 12. Photoimageable Composition

An approximately 50% solids photoimageable composition was formulated from the following reagents:

| | |
|---|---|
| Acid functional thiol resin described in Example 6: | 1.00 g |
| Triallyl cyanurate (DeGussa) | 0.20 g |
| Diallyloxy benzophenone: | 0.34 g |
| Epon 164 epoxy novolak resin (Shell Chemical) | 0.17 g |
| Irgacure 907 (Ciba): | 0.09 g |
| Isopropyl thioxanthone (First Chemical) | 0.02 g |
| Cab-o-sil TS-720 (Cabot): | 0.33 g |
| Acetone: | 2.0 g |

This composition was applied to a copper clad epoxy/fiberglass laminate using a drawdown bar to produce an approximately 2 mil coating. The board was dried for 30 min. in a 70° C oven to yield a tack free film. The film was then contact imaged in air through a phototool using a Colight 1330C 5 kW UV lamp. Exposure energy was approximately 360 mJ/cm$^2$. The unexposed regions of the coating were readily developed from the board using a 1% aqueous carbonate solution to produce an image with better than 5×5 mil resolution. The mask can be further baked in a 150° C. oven for 30 min. to yield a tough, scratch resistant protective coating.

Example 13. Photoimageable Composition

An approximately 50% solids photoimageable composition was formulated from the following reagents:

| | |
|---|---|
| Acid functional thiol resin described in Example 9: | 0.50 g |
| Triallyl cyanurate (DeGussa) | 0.14 g |
| Irgacure 651 (Ciba): | 0.03 g |
| Triphenyl phoshine: | 0.01 g |
| Acetone: | 1.0 g |

This composition was applied to a copper clad epoxy/fiberglass laminate using a drawdown bar to produce an approximately 2 mil coating. The board was dried for 30 min. in a 70° C. oven to yield a tack free film. The film was then contact imaged in air through a phototool using a Colight 1330C 5 kW UV lamp. Exposure energy was approximately 360 mJ/cm$^2$. The unexposed regions of the coating were readily developed from the board using a 1% aqueous carbonate solution to produce an image with high resolution. The mask can be further baked in a 150° C. oven for 30 min. to yield a tough, scratch resistant protective coating.

Example 14. Photoimageable Composition

An approximately 50% solids photoimageable composition was formulated from the following reagents:

| | |
|---|---|
| Acid functional thiol resin described in Example 10: | 0.50 g |
| Triallyl cyanurate (DeGussa) | 0.20 g |
| Irgacure 651 (Ciba): | 0.09 g |
| Acetone: | 1.0 g |

This composition was applied to a copper clad epoxy/fiberglass laminate using a drawdown bar to produce an approximately 2 mil coating. The board was dried for 30 min. in a 70° C. oven to yield a film with slight tack. The film was then imaged in air through a phototool using a Colight 1330C 5 kW UV lamp. Exposure energy was approximately 360 mJ/cm$^2$. The unexposed regions of the coating were readily developed from the board using a 1% aqueous carbonate solution to produce an image with good resolution. The mask can be further baked in a 150° C. oven for 30 min. to yield a tough, scratch resistant protective coating.

What is claimed is:

1. A photoimageable composition developable in aqueous base comprising (i) an acid-functional thiol-functional resin having two or more primary aliphatic thiol groups having no hydroxy substituents in the beta positions with respect to the sulfur atom, and a thermally stable backbone with substantial aromatic, cyanurate or isocyanurate character, (ii) a polymerizable unsaturated resin and (iii) a photoinitiator.

2. The photoimageable composition of claim 1, wherein the thiol-functional resin is a derivative of an unsaturated Novolak resin.

3. The photoimageable composition of claim 1 wherein the thiol-functional resin is a derivative of an unsaturated cyanurate or an isocyanurate resin.

4. The photoimageable composition of claim 1 wherein the thiol-functional resin is a derivative of the group consisting of an allylated Novolak, cyanurate and isocyanurate resins.

5. The photoimageable composition of claim 4, wherein the thiol-functional resin is a derivative of tetraallylated Bisphenol A.

6. The photoimageable composition of claim 4, wherein the thiol-functional resin is a derivative of hexaallylated Bisphenol A.

7. The photoimageable composition of claim 4, wherein the thiol-functional resin is a derivative of a polyallylated phenol novolak resin.

8. The photoimageable composition of claim 1 wherein the thiol-functional resin is the hydrolyzed a reaction product of an unsaturated Novolak resin and a mixture of thiolacetic acid and β-mercaptopropionic acid.

9. The photoimageable composition of claim 1 wherein the acid-functional, thiol-functional resin is a reaction product of a thiol-functional phenol or cresol Novolak resin and a cyclic anhydride selected from the group consisting of maleic, succinic, trimellitic, phthalic, tetrahydrophthalic, hexahydrophthalic anhydride and blends thereof.

10. The photoimageable composition of claim 1, wherein the thiol-functional resin is a reaction product of an unsaturated resin having a backbone selected from the group consisting of aromatic, cyanurate, and isocyanurate oligomers and blends thereof, and a group capable of inserting an acid-functional moiety selected from the group consisting of cyclic anhydrides and a mixture of thiolacetic acid and β-mercaptopropionic acid.

11. The photoimageable composition of claim 1, further comprising one or more photosensitizers, inhibitors, pigments, dyes, fillers, stabilizers, solvents, adhesion promoters, thiol-containing oligomers, epoxy resins, or rheology aids.

12. The photoimageable composition of any one of claim 1, or 11, wherein the polymerizable unsaturated resin is substantially ester-free.

13. The photoimageable composition of any one of claim 1, or 11, wherein the polymerizable unsaturated resin has two or more unsaturated groups.

14. The photoimageable composition of any one of claim 1, or 11, wherein the polymerizable unsaturated resin has substantial aromatic, cyanurate, or isocyanurate character.

15. A method of making a photoimageable composition developable in aqueous base, the steps comprising
   a. adding thiolacetic acid and 8-mercaptopropionic acid to an unsaturated compound that is totally ester-free, and has a thermally stable backbone with substantial aromatic, cyanurate or isocyanurate character, under conditions suitable to induce free radical addition of the mercaptan groups of the thiolacetic acid and B-mercaptopropionic acid to the allyl groups of the unsaturated compound to produce a reaction product,
   b. hydrolyzing the reaction product, and
   c. blending the reaction product with a polymerizable unsaturated resin and a photoinitiator.

16. The method of claim 15 wherein the step of hydrolyzing the reaction product is performed under basic conditions.

17. The method of claim 15, wherein the step of hydrolyzing the reaction product is performed under acidic conditions.

18. The method of claim 15, wherein the backbone of the unsaturated compound is selected from the group consisting of novolak, cyanurate and isocyanurate resins.

19. The method of claim 18, wherein the unsaturated compound is a phenol novolak resin.

20. The method of claim 18, wherein the unsaturated phenol novolak resin is a tetraallyl derivative of Bisphenol A.

21. The method of claim 18, wherein the unsaturated phenol novolak resin is a hexaallyl derivative of Bisphenol A.

22. A method of making a photoimageable composition developable in aqueous base, the steps comprising
   a. adding a cyclic anhydride to a totally ester-free, thiol-functional resin having two or more primary aliphatic thiol groups having no hydroxy substituents in the beta positions with respect to the sulfur atom, and a thermally stable backbone with substantial aromatic, cyanurate or isocyanurate character under conditions suitable to induce reaction of a portion of the thiol functionality of the resin with the anhydride, thereby producing a reaction product and,
   b. blending the reaction product with a polymerizable unsaturated resin and a photoinitiator.

23. The method of claim 22, wherein the thiol-functional resin is a derivative of a phenol novolak resin.

24. The method of claim 23, wherein the phenol novolak resin is a tetraallyl derivative of Bisphenol A.

25. The method of claim 23, wherein the phenol novolak resin is a hexaallyl derivative of Bisphenol A.

26. The method of claim 22, wherein the anhydride is selected from the group consisting of maleic, succinic, trimellitic, phthalic, tetrahydrophthalic, and hexahydrophthalic anhydride.

27. The method of claim 22, wherein the anhydride is trimellitic anhydride.

28. The method of claim 22, wherein the anhydride is phthalic anhydride.

29. The method of claim 22, wherein the anhydride is hexahydrophthalic anhydride.

* * * * *